(12) United States Patent
Li (10) Patent No.: US 6,358,314 B1
(45) Date of Patent: Mar. 19, 2002

(54) CZOCHRALSKI CRYSTAL GROWTH SYSTEM WITH AN INDEPENDENTLY SUPPORTED PULL HEAD

(75) Inventor: Zhixin Li, Hudson, NH (US)

(73) Assignee: SPX Corporation, Muskegon, MI (US)

( * ) Notice: Subject to any disclaimer, the term of this patent is extended or adjusted under 35 U.S.C. 154(b) by 0 days.

(21) Appl. No.: 09/432,528

(22) Filed: Nov. 3, 1999

Related U.S. Application Data (60) Continuation-in-part of application No. 09/177,269, filed on Oct. 22, 1998, now Pat. No. 6,042,645, which is a division of application No. 08/786,878, filed on Jan. 23, 1997, now Pat. No. 5,879,452.
(60) Provisional application No. 60/010,575, filed on Jan. 25, 1996.

(51) Int. Cl.[7] .............................................. C30B 15/00
(52) U.S. Cl. ....................................................... 117/13
(58) Field of Search ........................... 117/13, 200, 206, 117/208, 218, 221, 900

(56) References Cited

U.S. PATENT DOCUMENTS

| | | | | |
|---|---|---|---|---|
| 4,660,149 A | * | 4/1987 | Lissalde et al. | 364/477 |
| 5,879,452 A | * | 3/1999 | Li | 117/208 |
| 5,944,892 A | * | 8/1999 | Li | 117/208 |
| 5,968,267 A | * | 10/1999 | Li | 117/221 |
| 6,042,645 A | * | 3/2000 | Li | 117/13 |

* cited by examiner

Primary Examiner—Benjamin L. Utech
Assistant Examiner—Matthew Anderson
(74) Attorney, Agent, or Firm—Baker & Hostetler, L.L.P.

(57) ABSTRACT

A pull head of a Czochralski crystal puller is mounted on a receiving chamber via a mounting apparatus that provides for pull head alignment. The mounting apparatus has a top plate for secured to the receiving chamber, a bottom plate for supporting the pull head, and an adjustment mechanism disposed on the bottom plate for adjustably positioning the top plate with respect to the bottom plate, and, thus, the puller head with respect to the receiving chamber. Accordingly, the pull head can be adjusted with respect to the crucible rotation axis and can be positioned in order to insure that its rotation axis is substantially vertical.

3 Claims, 7 Drawing Sheets

CZOCHRALSKI CRYSTAL GROWTH SYSTEM WITH AN INDEPENDENTLY SUPPORTED PULL HEAD

RELATED APPLICATIONS

This application is continuation-in-part of Ser. No. 09/177,269, filed Oct. 22, 1998, now U.S. Pat. No. 6,042,645, which was a division of Ser. No. 08/786,878, filed Jan. 23, 1997, now U.S. Pat. No. 5,879,452, which was based on a provisional U.S. patent application entitled CZOCHRALSKI CRYSTAL PULLER WITH INDEPENDENTLY SUPPORTED PULL HEAD SYSTEMS, filed Jan. 25, 1996 by Zhixin Li and assigned Ser. No. 60/010,575.

FIELD OF THE INVENTION

This invention relates to crystal growing systems and, more particularly, to a method of, and apparatus for, pulling a seed and ingot from a melt.

BACKGROUND OF THE INVENTION

Several techniques are known in the art for growing crystals. The Czochralski (CZ) process is the most widely used technique for growing crystal ingots used in the manufacture of integrated circuit (IC) chips. In the CZ process, a crystal puller system grows solid, single crystal ingots from melted charge material. High-quality ingots are substantially free of defects, have a uniformity of characteristics throughout the ingot, and are largely uniform from one ingot to the next.

A modern CZ crystal puller typically includes a crucible which holds a liquid melt form of a charge material, such as silicon from which the crystal is to be grown. The crucible is surrounded by a furnace that heats the charge to a melted state (the "melt"). The crucible and furnace are located in a sealed vacuum chamber which includes the components: a growth chamber that surrounds the furnace, a transition chamber located above the growth chamber and an elongated receiving chamber which holds the crystal as it grows. The vacuum chamber allows the environment around the growing crystal to be controlled. A vacuum slide valve located between the receiving chamber and the transition chamber can be used to isolate the two chambers. The vacuum chamber components typically are bolted together with vacuum seals between the pieces.

During the pulling process, a pull head mounted on the top of the receiving chamber holds a "seed" crystal at the end of a vertical rod or a cable and lowers the seed to contact the melt. Upon contacting the melt, the seed causes a local decrease in melt temperature, which causes a portion of the melt to crystallize around the seed. The seed is then slowly withdrawn from the melt, passed through the transition chamber and passed into the receiving chamber by the pull head. As the seed is withdrawn, the portion of the newly-formed crystal that remains within the melt essentially acts as an extension of the seed and causes more melt to crystallize around the seed. This above process is continued until the crystal is grown to the desired size, e.g., eight to ten feet long and weighing about 150 Kg. Eventually, the finished crystal is lifted entirely into the receiving chamber, which is then detached from the remaining portion of the vacuum chamber system so that the crystal may be retrieved.

To lift the seed and eventually the ingot, a typical pull head includes a controllable winch having a cable affixed to the seed and the attached ingot. Conventionally, the pull head is attached directly to the top of the receiving chamber, so that, as the receiving chamber is moved or detached, the pull head moves with it. To improve an ingot's uniformity, in many systems, the pull head is mounted on a plate that is rotatable with respect to a base which is, in turn, is mounted on the receiving chamber. The rotatable plate allows the pull head to rotate around a vertical longitudinal axis of the crystal during the pulling operation so that the pulling cable, the seed crystal and the ingot rotate around the crystal longitudinal axis as the ingot is withdrawn from the melt. In addition, to further improve uniformity, the crucible containing the melt is often rotated about a vertical axis parallel to the same crystal longitudinal axis as well.

To insure uniform crystal growth, the pull head must be carefully aligned relative to the crucible so that the axis of rotation of the cable system aligns with the axis of rotation of the crucible. Further, the pull head itself must be positioned so that its rotational axis is vertical. However, the position of the receiving chamber relative to the rotational axis of the crucible is dependent on the tolerance stack-up of the base chamber, grow chamber, transition, isolation valve and receiving chamber. This structure renders it difficult to achieve an accurate alignment. Furthermore, the receiving chamber must be removed from the vacuum chamber structure and then replaced during each crystal pulling process. Each time the receiving chamber is replaced, it may not be returned to its exact previous position due to the tolerances in the chamber pieces. Consequently, it is difficult to exactly align the pulling cable to the pulling head axis and the crucible rotational axis. Further, the pulling head may become tilted so that the rotational axis of the pulling head varies from true vertical.

It has been found that this misalignment among the pulling cable, the pulling head axis, and the crucible rotational axis, as well a tilting of the pulling head, will deteriorate the growing condition of the crystal and render the rotating pulling cable/crystal susceptible to an orbiting motion which may be very harmful to the crystal quality and may even disrupt the crystal growing process.

Consequently, there is a need in the art for improved methods and apparatus for growing crystal ingots that provide stable, repeatable growth of crystal ingots.

It is an object of the invention to provide an improved method of, and apparatus for, pulling a crystal ingot from a melt.

It is another object to increase the stability of the crystal growing process, primarily by improving the ability to align the pulling cable and improving the repeatability of the alignment.

SUMMARY OF THE INVENTION

In accordance with a first embodiment of the invention, the pull head of a CZ crystal puller is mounted on a frame which is supported independently from the receiving chamber. In particular, the pull head is mounted on a rigid frame which is supported by the same surface that supports the crucible. The pull head thereby can be aligned relative to the rigid frame, rather than to the receiving chamber, and can be accurately aligned with the crucible rotation axis and positioned in order to insure that its rotation axis is vertical.

More specifically, in an illustrative implementation, the pull head is mounted on a plate which engages alignment pins attached to the rigid frame. The alignment pins insure proper alignment of the pull head relative to the frame. When the receiving chamber is raised to allow the crystal to be removed, the plate is engaged by the receiving chamber and is lifted off the alignment pins so that the pull head moves with the receiving chamber. When the receiving chamber is returned to its ingot-growing position and lowered, the alignment pins reengage the plate to realign the pull head on the frame. In this embodiment, the pull head is connected to the receiving chamber by a flexible bellows so that the pull head remains vacuum sealed to the receiving chamber when the chamber is lowered and the alignment pins are engaged.

In accordance with an alternative embodiment of the invention, a pull head of a CZ crystal puller is mounted on a receiving chamber, rather than on the frame, via a mounting apparatus that provides for pull head positional adjustment and alignment. The mounting apparatus has a bottom plate secured to the receiving chamber, a top plate for supporting the pull head, and an adjustment mechanism fixedly disposed with respect to the receiving chamber for adjustably positioning (preferably with six degrees of freedom (DOF)) the top plate (and the pull head) with respect to the receiving chamber. To that end, the mounting apparatus is equipped with jack screws for manual adjustment of the relative positions of these components. Accordingly, the pull head can be adjusted with respect to the crucible rotation axis and be positioned in order to insure that its rotation axis is vertical.

DESCRIPTION OF PREFERRED EMBODIMENT

Figure 1:
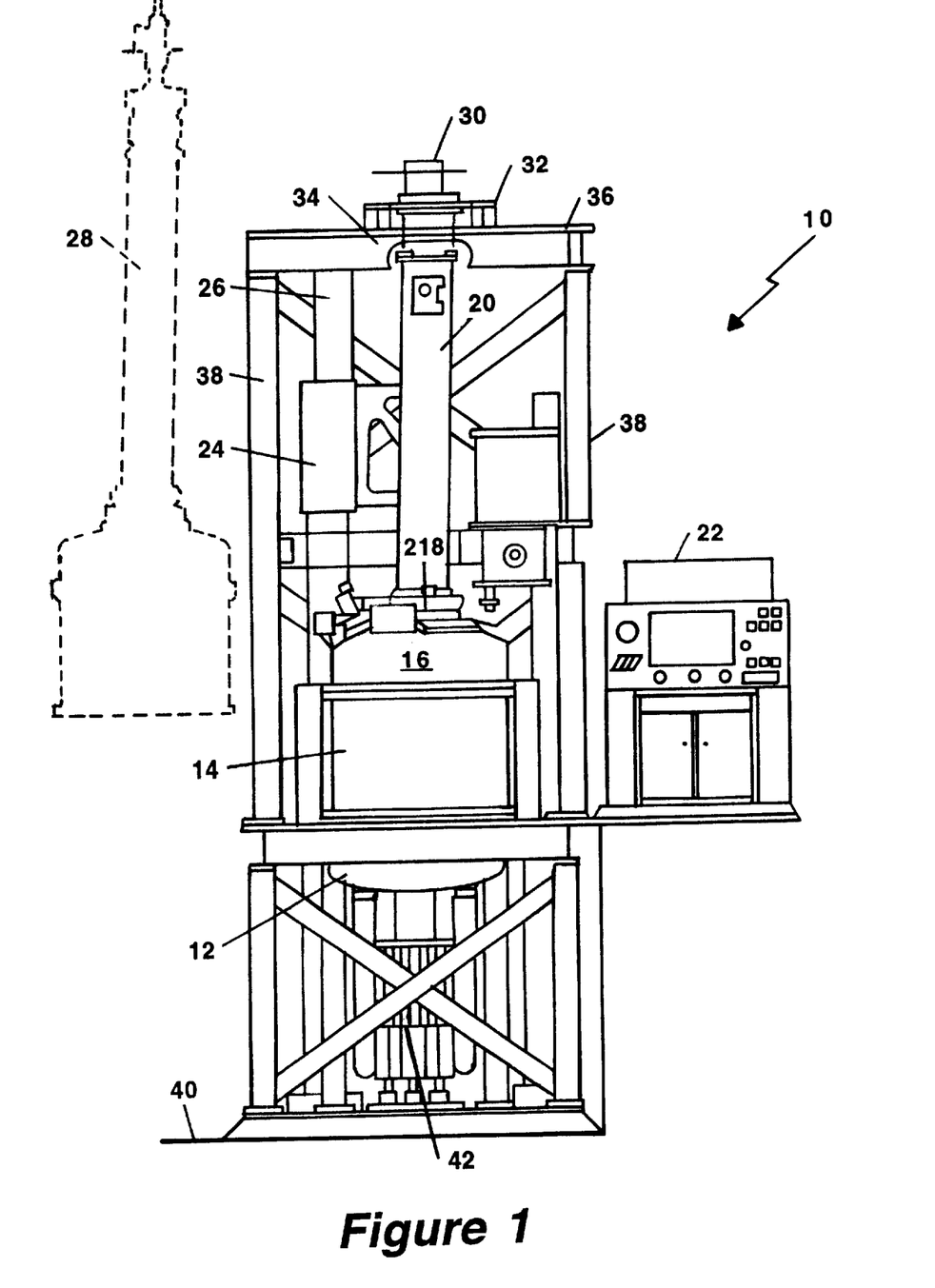
FIG. 1 is an elevation view of a CZ crystal puller system, including a preferred embodiment of the invention.
Figure 2:
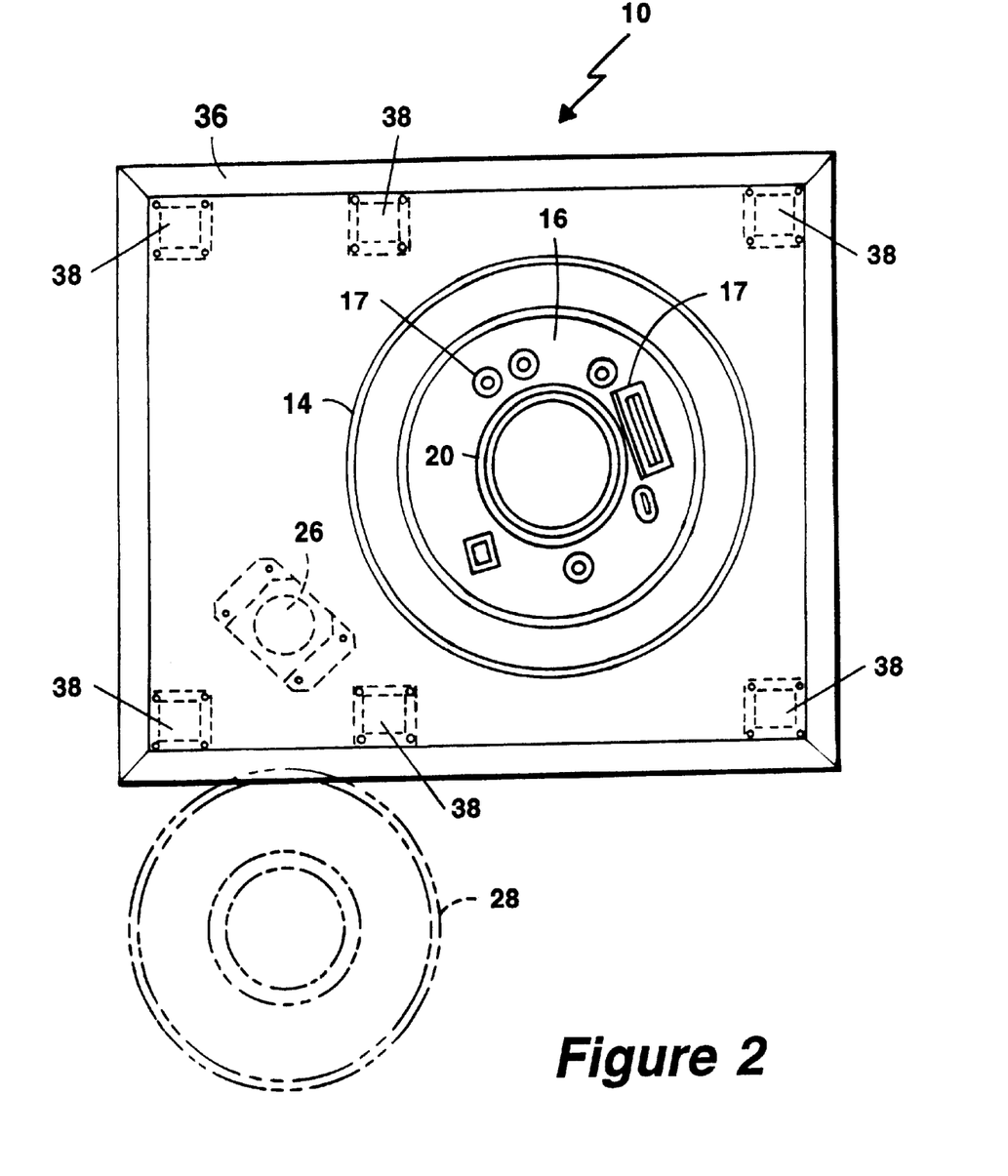
FIG. 2 is a plan view of the CZ crystal puller illustrated in FIG. 1.

Referring to FIGS. 1 and 2, the basic puller system 10 includes base chamber 12, growth chamber 14, transition chamber 16, isolation valve 18 and receiving chamber 20. The base chamber 12 encloses a mechanism which supports a crucible and raises it as the crystal is withdrawn therefrom in order to maintain the melt level in the crucible constant with respect to the remainder of the system 10. The growth chamber 14 encloses the crucible and a furnace surrounding the crucible for melting the charge material in the crucible. The transition chamber 16 includes a number of viewing and instrumentation ports 17 in its upper surface which allow the crystal pulling process to be monitored by an operator. The receiving chamber 20 receives the grown crystal ingot (not shown), carried by a cable or rod (not shown), in a manner similar to that described above.

A control system 22 monitors various growth parameters, such as the melt-level, and controls various aspects of the system, such as the rate at which a seed is withdrawn from the melt. Lift 24, attached to the receiving chamber 20, slides along pole 26 under the control of the control system 22 and may be used to lift and rotate the combination 28 of growth chamber 14, transition chamber 16 and receiving chamber 20 about the longitudinal axis of pole 26, to move the combination 28 away from the base chamber 12. By operating in this fashion, the system may be cleaned. Alternatively only the combination of the transition chamber 16 and the receiving chamber 20 on the receiving chamber 20 alone can be moved by lift 24 so that the ingot therein may be retrieved from the system 10.

Figure 3:
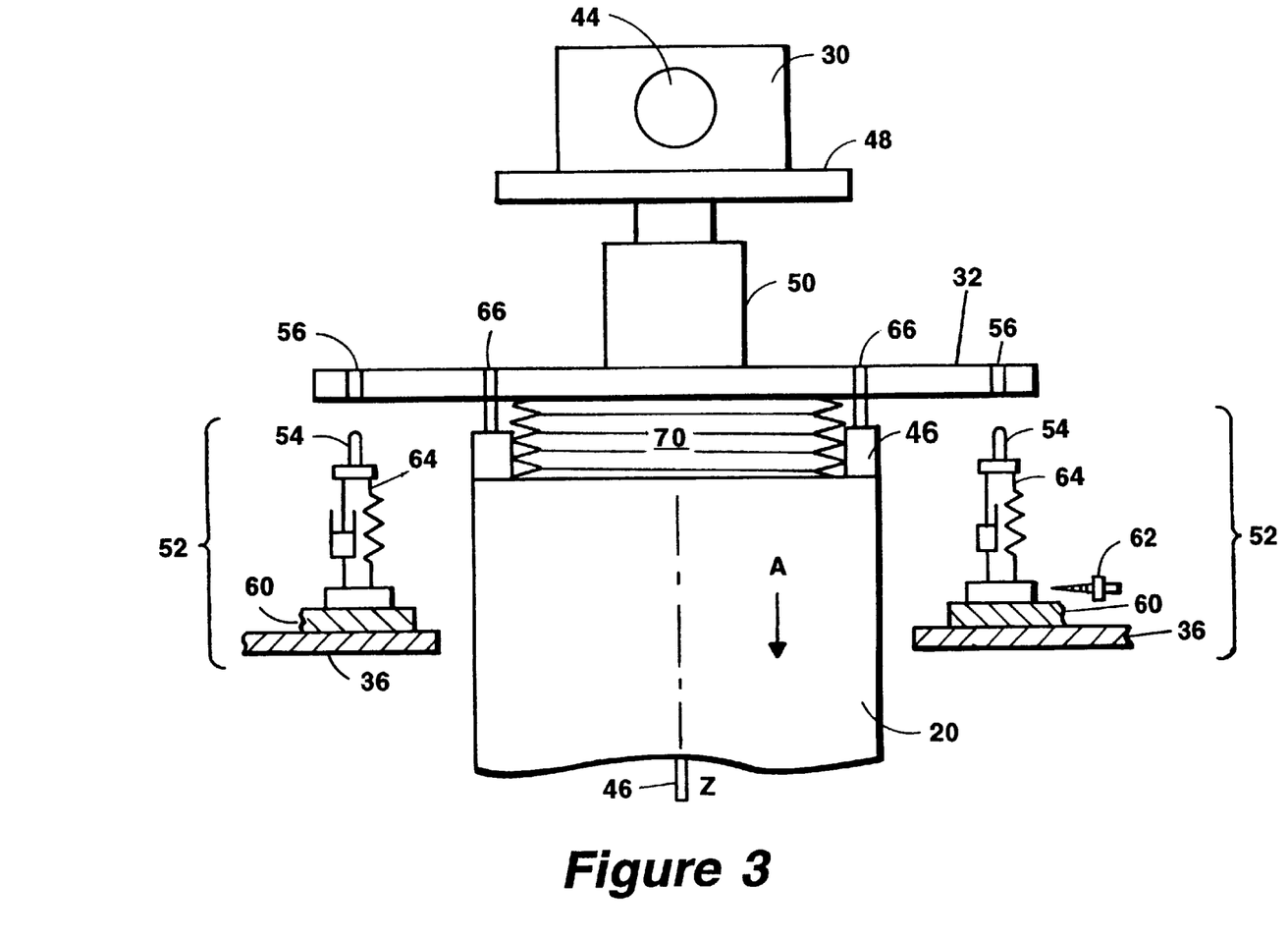
FIG. 3 is a side view of a pull head decoupled from the independent alignment system of this invention.
Figure 4:
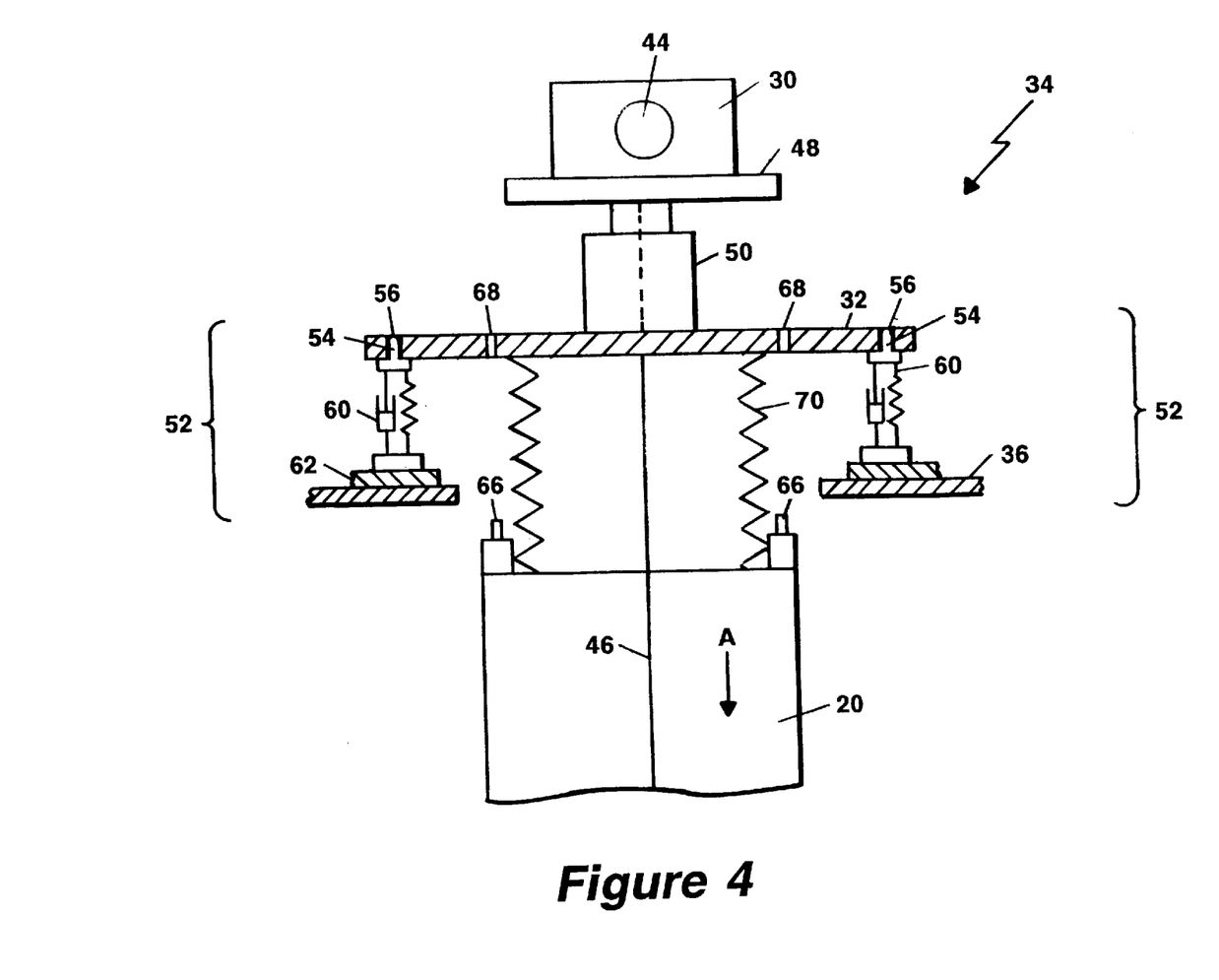
FIG. 4 is a side view of the pull head mounted using an independent alignment system of FIG. 3 with the CZ receiving chamber lowered in the crystal growing position.

FIGS. 3 and 4 are more detailed, enlarged views of the pull head 30 in relation to the support beam 36. Unlike conventional crystal puller systems, the pull head 30 of system 10 (not shown in FIG. 2) is coupled to an independent support and alignment structure rather than being directly mounted on the receiving chamber 20. More particularly, the pull head 30 is coupled to plate 32, which, in turn, is positioned with the aid of alignment structure 34 on a rigid support structure consisting of support beam 36 supported by a framing structure 38. Structure 38 illustratively rests on the same supporting surface 40 as the crucible lift and rotate mechanism 42 so that there is no relative motion between the two structures. FIG. 3 shown the alignment mechanism 52 decoupled from the plate 32 which illustrates the position of the pull head 30 when the receiving chamber is being moved relating to the transition chamber 6. Pull head 30 includes a conventional winch motor 44, which lifts the pulling cable 46 within receiving gig chamber 20 under the control of the control system 22 (FIG. 1) in order to rotate the crystal within receiving chamber 20. The pull head 30 is mounted on rotatable plate 48, which may rotate under the control of the control system 22. The rotatable plate 48, in turn, is coupled to plate 32 by a ferrofluidic seal 50 through which the cable 46 passes.

FIG. 4 shows the receiving chamber 20 located in the lowered position for crystal growth while the alignment mechanism 52 is coupled to plate 32. In this position, the pull head 30 is effectively coupled to the supporting beam 36 by means of the support structures 52. A tapered alignment pin 54 is provided on the top of each of support structures 52, which may illustratively be conical in shape, engage holes 56 in plate 32. Holes 56 are shaped to match the outer contour of pins 54 (for example, holes 56 may have a conical shape) in order to provide a positive and repeatable alignment of the plate 32 on support structures 52. For example, three support structures 52 with alignment pins 54 can be used arranged in a triangular pattern around the centerline of pull head 30. Alternatively, four support structures with alignment pins can be used. When plate 32 is resting on alignment pins 54, the alignment of pull head 30 is independent of the position of receiving chamber 20 and, instead, depends on the position of stationary support beam 36.

To align the plate 32, and thus the pull head 30 with the rotation axis of crucible 12 (FIG. 1) and to insure that the rotation axis of pull head 30 is vertical, each support structure 52 is mounted on a conventional XYZ table, such as table 60. The XYZ table 60, in turn, is mounted on support beam 36. The XYZ table thus allows the support structures 52, which rest on it, to be aligned in the X, Y, and Z directions relative to the support beam 36 by means of adjustment screws, such as screw 62, in a conventional fashion. Prior to crystal growth, the XYZ table 60 is carefully adjusted to render the pull head axis of rotation colinear with the crucible rotation axis and to render the pull head axis of rotation vertical. Once this adjustment is performed, it does not need to be changed since this alignment is relative to stationary support beam 36 which is rigidly supported by the frame 38, rather than being dependent upon tolerances built up in the vacuum chamber pieces. Because this alignment is independent of the receiving chamber's tolerances, among others, the alignment structures 52 provide a stable, constant alignment from one ingot growing cycle to the next cycle. Moreover, because the alignment of the plate 32 relative to support beam 36 is not expected to change from one ingot growing cycle to the next cycle, the alignment structure 52 is believed to provide more repeatability to the growing process, as the alignment of the cable 46 relative to crucible 12 (FIG. 1) will not change from one growing cycle to the next cycle.

The puller head 30 in FIG. 3 is decoupled from the independent alignment structure 52. The puller head 30 and plate 32 are coupled to receiving chamber 20 with pins 66 which are positioned within holes 68. Plate 32 can move orthogonally relative to the axis of the cable since bellows 70 is compressible. In addition to being sufficiently flexible to allow orthogonal movement of the plate 32, bellows 70 provides a means for maintaining a vacuum seal within the receiving chamber 20. Alignment structure 52 includes tapered locating ends 54 to engage holes 56 in plate 32. Pins 54 are mounted on rigid frame 36 by vibration dampeners 64. Locating pins 54 are adjustable by adjusting XYZ table 60 to align the puller head 30 relative to rigid independent structure 36.

When the receiving chamber 20 is detached from the transition chamber 18 and repositioned by the lift 24, the puller head 30 is lifted from independent support structure 38 and moved with the receiving chamber 20. Thereafter, when the receiving chamber is returned to a position to initiate growth crystal, the puller head 30 is aligned by utilizing the alignment mechanism 52 in conjunction with the support structure 36. When the receiving chamber 20 is lowered in the direction of arrow A, holes 56 and locating pins 54 engage each other while pins 66 and hole 68 eventually disengage from each other.

The support structures 52 may be rigid rods, but preferably, the structures are conventional vibration damper devices 64. Vibration dampers which are suitable for use with the present invention are model 6-DOF vibration dampers manufactured and sold by Minus K Technology, located in 420 S. Hindry Ave., Inglewood, Calif. 90301.

OTHER EMBODIMENTS

Figure 5:
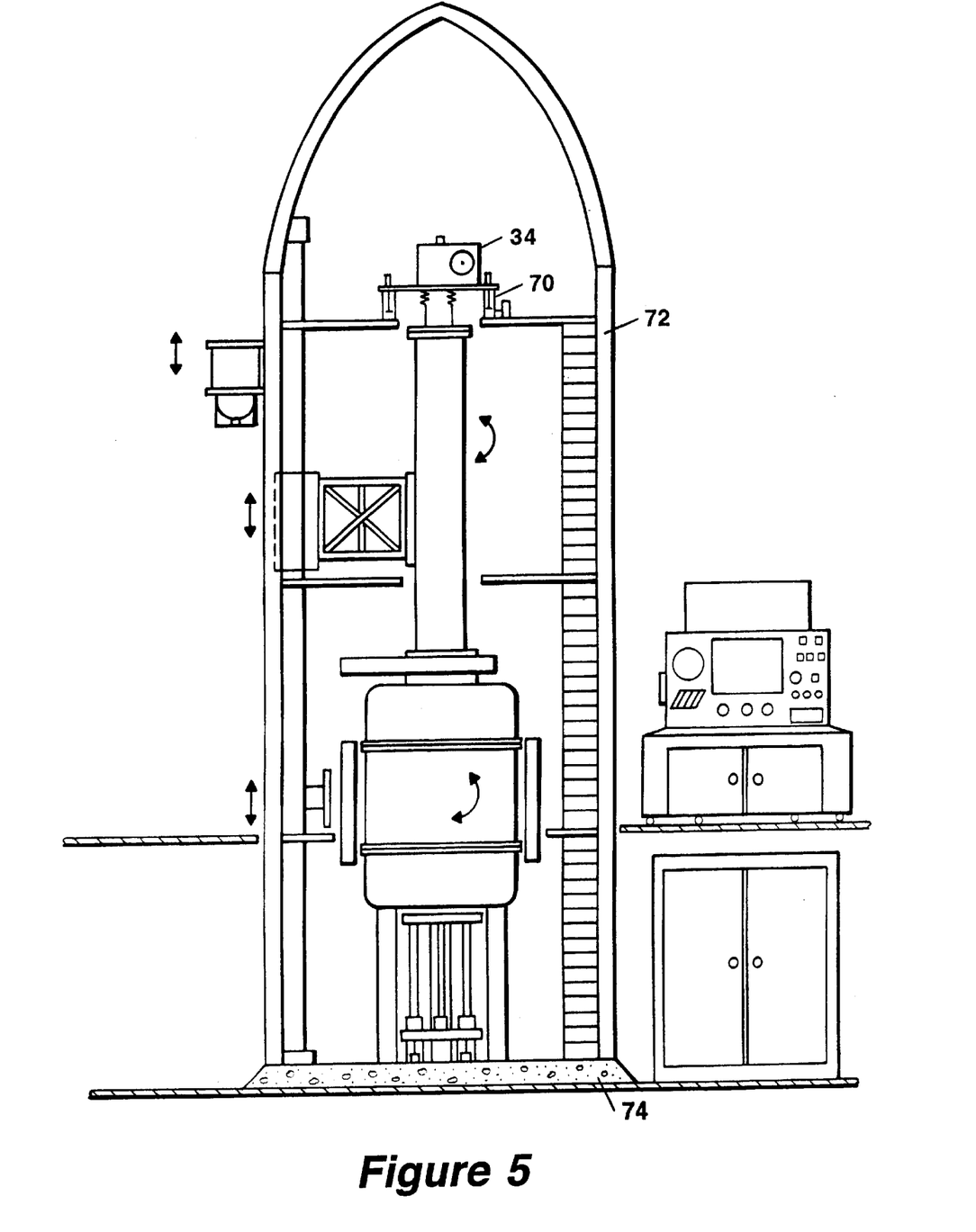
FIG. 5 is a side view of an alternative crystal puller design using the invention.

The above embodiments are exemplary and skilled artisans will appreciate that the inventive concept of aligning a pull head independently of the receiving chamber is applicable to other structures. For example, the XYZ table 60 of FIGS. 3 and 4 may be replaced with an XY table may be used with vertical adjustment accomplished using leveling screws provided on vibration dampers 64. Analogously, other crystal pullers assemblies may advantageously use the invention. For example, the crystal puller of FIG. 5 similarly uses an alignment mechanism 70 for the pull head 34 which is attached to the rigid support 72, while being connected directly to the ground 74.

Figure 6:
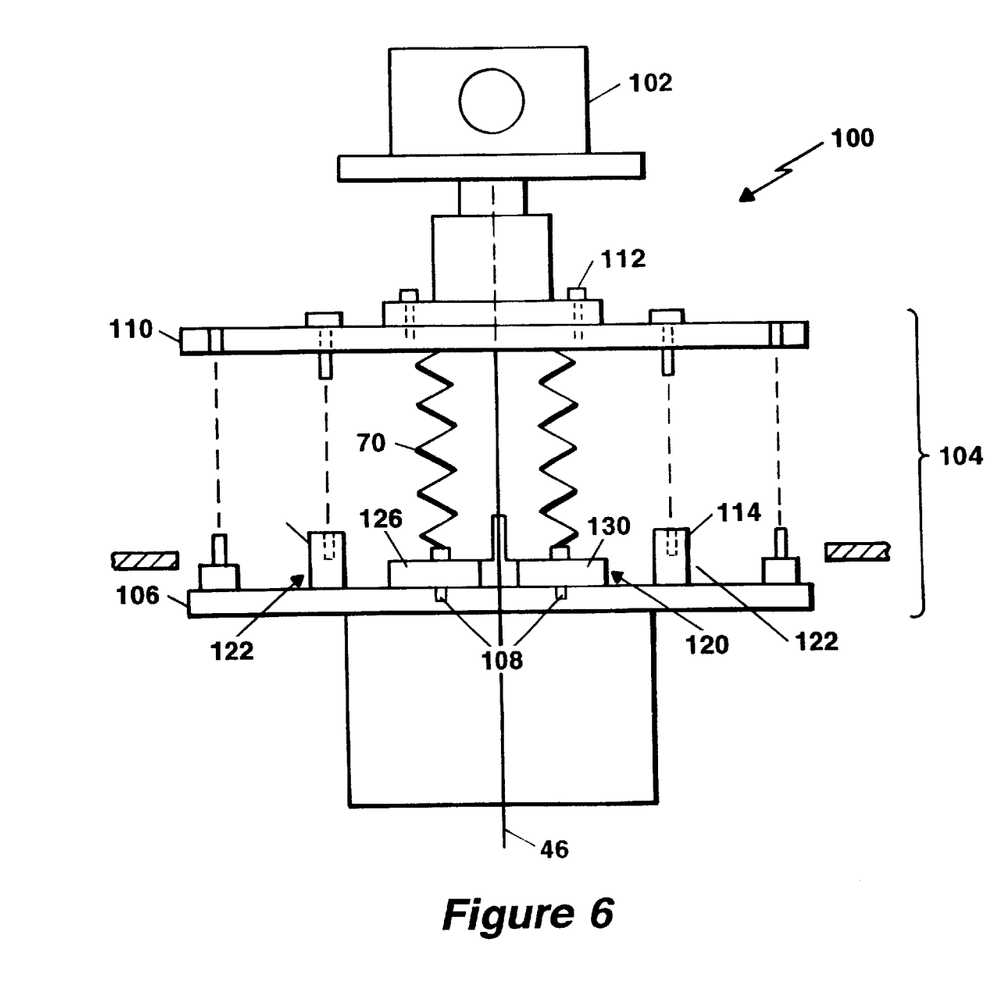
FIG. 6 is a side view of a pull head adjustably mounted on a receiving chamber in accordance with yet another embodiment of the invention.
Figure 7:
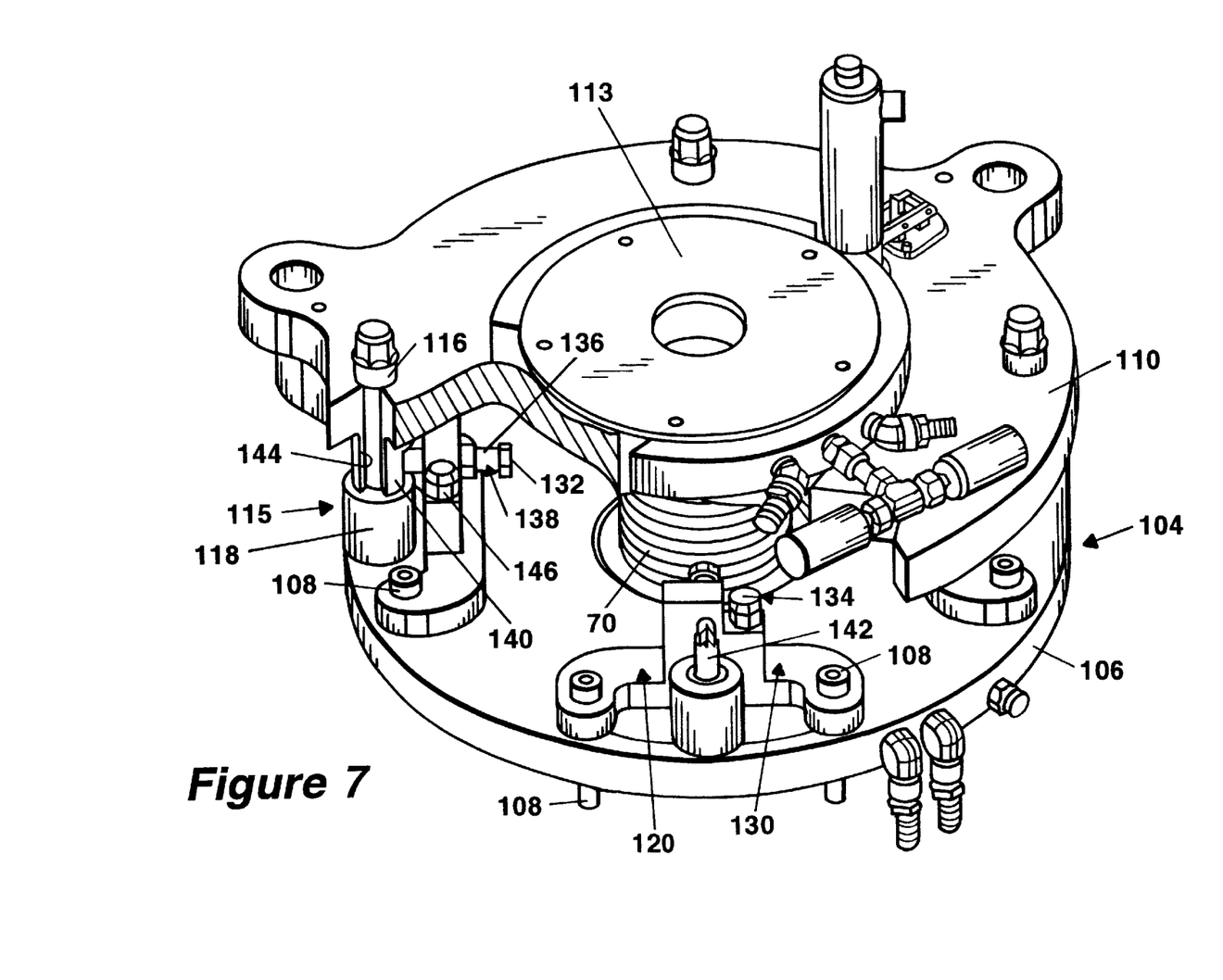
FIG. 7 is a perspective view, partially broken away, of the adjustment apparatus shown in FIG. 6.

FIGS. 6 and 7 show a puller system 100 having a pull head 102 mounted in accordance with yet another embodiment of the invention. Like conventional crystal puller systems, the pull head 102 is mounted on the receiving chamber 20; however, unlike such conventional systems, the mounting is effected by means of a novel mounting apparatus 104 that provides for pull head positional adjustment and alignment.

The mounting apparatus 104 has a first structure, e.g., a bottom plate 106 fixedly attached to the receiving chamber 20 (e.g., via screws 108 or other conventional fasteners). The mounting apparatus 104 also has a second structure, e.g., a top plate 110, on which the pull head 102 (FIG. 6) can be fixedly attached (e.g., via screws 112 or other conventional fasteners). Thus, the pull head rests on the top plate, and the bottom plate rests on the top of the receiving chamber. During assembly, the top plate 110 is placed on the bottom plate 106, and their relative positions adjusted. To facilitate the assembly, the mounting apparatus 104 can employ an arrangement 115 consisting of pins 116, which extend through the top plate 110 and into enlarged cylindrical bushings 118 that can rest on the bottom plate 106.

As can be seen best in FIG. 7, the mounting apparatus 104 also includes an adjustment mechanism 120 for adjustably mounting the top plate 110 (and, thus, the pull head 120 to which it is secured) onto the bottom plate 106 (and, thus, onto the receiving chamber 20). The adjustment mechanism 120 allows the position of the top plate 110 to be adjusted, e.g., manually, with respect to the position of the bottom plate 106, preferably with six degrees of freedom (DOF). In other words, the adjustment mechanism 120 allows a technician to adjust the relative positions of the top and bottom plates 110, 106, (and the pull head 120 and receiving chamber 20), for example, translationally along an x-axis, y-axis and/or z-axis, as well as angularly about those axes.

The illustrated adjustment mechanism 120 includes multiple (e.g., four) mounting blocks 122, 124,126 (and another not shown), which are equi-angularly spaced about the pulling cable 46 (FIG. 6). Each mounting block 122–128 includes an elongated body member 130 of preferably single-piece construction attached at its distal ends to the bottom plate 106, e.g., by the screws 108. Each mounting block 122, 124, 126, also is equipped with a horizontal jack screw 132 and a vertical jack screw 134 for making positional adjustments.

The horizontal jack screw 132 has a shank 136 extending in a radial direction relative to the pulling cable 46 (FIG. 6), and terminating at a free end whose position controls the position of the top plate 110 with respect to the bottom plate 106. More particularly, the top plate 110 is provided with a tubular extension 140, which is preferably formed integral with and extends downwardly from the top plate 110. During assembly, the free ends of the horizontal jack screws are placed (by rotating the screws) at selected positions so that, when the top plate 110 is placed on the bottom plate, the tubular extensions 140 fit between the free ends of the jack screws 132. Then, the horizontal jack screws 132 can be turned, so as to contact the tubular extensions 140 and drive the top plate 110 to a desired horizontal position relative to the bottom plate 106.

The vertical screws 134 extends in a vertical direction, generally parallel to the pulling cable 46 (FIG. 6), terminating in threaded engagement with the bottom plate 106. The top plate 110 rests on and is supported by heads 146 of the vertical screws 134. The vertical jack screws 134 can be turned, so as to drive the top plate 110 to a desired height above the bottom plate 106. Accordingly, rotation of the jack screws 132, 134 by a technician causes relative positioning of the top and bottom plates 110, 106, and thus of the pull head and the receiving chamber. Rotation of the horizontal jack screws 132 causes the top plate 110 to move radially with respect to the bottom plate 106. Rotation of the vertical jack screws 134 raises or lowers their heads 146, causing the top plate 110 to be supported at a changed height above the bottom plate 106. Rotating selecting ones of either the horizontal or vertical jack screws 132,134 without changing others, will cause angular changes in position of the plates

106, 110. The extent and direction of the repositioning depends on a number of factors, including the direction of jack screw threads, the direction in which the jack screws are rotated, and the particular ones of the jack screws being rotated. Accordingly, the adjustment mechanism 120 can used to adjust the pull head with respect to the crucible rotation axis to a position that insures that its rotation axis is vertical.

In accordance with another embodiment of the invention, the pull head 30 can be a "dual support" pull head, capable of support either on the frame as shown in FIGS. 3 and 4 or on the receiving chamber as shown in FIGS. 6 and 7 with the provision of the appropriate mounts and adjustment mechanisms described herein.

When the pull head is supported on the chamber with the adjustment blocks, it allows local six DOF adjustment of the pull head. Compared with conventional pull head mounting mechanisms, which directly mount the pull head on top of the chamber without the bellows, the second plate, and the adjustment mechanism, the new mounting mechanism provides more flexibility and simplifies pull head adjustment and alignment. For example, to make a tilted pull head vertical, with the new mounting mechanism, a technician need only adjust locally the jack screws of the adjustment blocks. If the conventional mounting mechanism were used, jack screws at the base of the chamber would have to be adjusted to make the pull head vertical. This can be difficult and complicated to achieve, particularly because the pull head is often thirty feet tall and thirty tons in weight.

The dual support mechanism provides the flexibility for the user to either mount the pull head on the frame or on the chamber. There are different advantages for each arrangement. For example, when the pull head is mounted on the frame, it provides stability and security, while mounting on the chamber provides simplicity of operation and convenience.

Another advantage of the dual mounting mechanism is that the frame and the chamber provide different natural frequencies. If the facility transmits a vibration frequency close to one natural frequency, the pull head can be mounted with the alternative way with a different natural frequency, thus reducing the vibration level of the pull head.

While the invention has been shown and described above with respect to various preferred embodiments, it will apparent that the foregoing and other changes of the form and detail may be made therein by one skilled in the art without departing from the spirit and scope of the invention.

What is claimed is:

1. A method for aligning a pull head in a crystal growing system having a multisection vacuum chamber including a receiving chamber and a crucible located in the vacuum chamber, the method comprising the steps of:

A. mounting the pull head on a mounting apparatus;

B. mounting the mounting apparatus on the receiving chamber; and

C. aligning the pull head relative to the receiving chamber and thus to the crucible using alignment adjustment features provided by the mounting apparatus.

2. The method according to claim 1 wherein the alignment adjustment features comprise a plurality of mountfing blocks, and the method further comprises the step of adjustably positioning the pull head with respect to the receiving chamber using the mounting blocks.

3. The method according to claim 2 wherein the adjustably positioning step further comprising the step of operating Plurality of jack screws provided by the mounting blocks so as to adjust the position of the pull head.

* * * * *